United States Patent
Chien et al.

(10) Patent No.: US 9,227,832 B1
(45) Date of Patent: Jan. 5, 2016

(54) PRESSURE SENSOR AND MANUFACTURE METHOD THEREOF

(71) Applicant: MiraMEMS Sensing Technology Co., Ltd., Suzhou (CN)

(72) Inventors: Yu-Hao Chien, Taipei (TW); Li-Tien Tseng, Taoyuan County (TW)

(73) Assignee: MIRAMEMS SENSING TECHNOLOGY CO., LTD, Suzhou (CN)

( * ) Notice: Subject to any disclaimer, the term of this patent is extended or adjusted under 35 U.S.C. 154(b) by 0 days.

(21) Appl. No.: 14/596,985

(22) Filed: Jan. 14, 2015

(30) Foreign Application Priority Data

Jun. 25, 2014 (TW) ............... 103121912 A

(51) Int. Cl.
| | |
|---|---|
| *H01L 21/54* | (2006.01) |
| *B81B 3/00* | (2006.01) |
| *B81B 7/00* | (2006.01) |
| *B81C 1/00* | (2006.01) |

(52) U.S. Cl.
CPC ............. *B81B 3/0005* (2013.01); *B81B 7/007* (2013.01); *B81C 1/00238* (2013.01); *B81C 1/00373* (2013.01); *B81B 2201/0264* (2013.01)

(58) Field of Classification Search
CPC .................................................. B81B 3/0005
USPC ..................................... 257/415, 417
See application file for complete search history.

(56) References Cited

U.S. PATENT DOCUMENTS

| | | | | |
|---|---|---|---|---|
| 2005/0095833 A1* | 5/2005 | Lutz | ...................... | B81B 3/0005 438/597 |
| 2005/0179099 A1* | 8/2005 | Lutz | .................... | B81C 1/00269 257/414 |
| 2006/0246631 A1* | 11/2006 | Lutz | ...................... | B81B 3/0005 438/127 |
| 2008/0050845 A1* | 2/2008 | Ulm | ...................... | B81C 1/0096 438/5 |
| 2014/0374856 A1* | 12/2014 | Chen | .................... | B81B 3/0005 257/418 |

* cited by examiner

*Primary Examiner* — George Fourson, III
(74) *Attorney, Agent, or Firm* — Muncy, Geissler, Olds & Lowe, P.C.

(57) ABSTRACT

A pressure sensor using the MEMS element and the manufacture method thereof utilize the semiconductor processes to form the micro channel connecting to the chamber, open the micro channel, coat the anti-sticking layer on the inner surface of the chamber, and then seal the micro channel to keep the chamber airtight. Therefore, the manufacture method may essentially simplify the process to coat the anti-sticking layer on the inner surface of the airtight chamber to prevent the sticking and failing of the movable MEMS element.

23 Claims, 7 Drawing Sheets

PRESSURE SENSOR AND MANUFACTURE METHOD THEREOF

BACKGROUND OF THE INVENTION

1. Field of the Invention

The present invention relates to a pressure sensor and a manufacture method thereof, particularly to a pressure sensor and manufacture method thereof complied with the Microelectromechanical System (MEMS) device.

2. Description of the Prior Art

Since the development in 1970, the Microelectromechanical System (MEMS) device has been improved from subject in the laboratory research to that for high-level system integration. The MEMS device also has a popular application and an amazing and stable growth in the public consumable field. The MEMS device is capable of achieving the functions of the device through detecting or controlling the kinematic physical quantity of the movable MEMS elements. Therefore, how to avoid failure of the MEMS device caused by sticking of the movable MEMS element has been always one of the most important goals of the MEMS device, particularly to the pressure sensor with the airtight chamber.

SUMMARY OF THE INVENTION

The present invention is directed to providing a pressure sensor and a manufacture method thereof implemented with the MEMS device. In the semiconductor process, an anti-sticking layer is coated on the inner surface of the airtight chamber to avoid failure of the MEMS device caused by sticking of the movable MEMS element.

The manufacture method of the pressure sensor according to one embodiment of the present invention comprises: providing a first substrate comprising a metal layer, wherein the metal layer is partially exposed on a surface of the first substrate to form a first circuit, a second circuit and a conductive contact; providing a second substrate having a first surface and a second surface; mounting the second substrate to the surface of the first substrate in which the first surface of the second substrate faces to the first substrate to define a first chamber, a second chamber and at least one micro channel, wherein the first circuit is configured in the first chamber, the second circuit is configured in the second chamber, and the micro channel extends outward from the first chamber along the border surface of the first substrate and the second substrate; forming a MEMS element and a reference element on the second substrate, wherein the MEMS element corresponds to the first circuit, and the reference element corresponds to the second circuit; forming at least a first via and a second via, wherein the first via and the second via penetrate the first surface and the second surface of the second substrate, the first via is connected to the micro channel, and the second via corresponds to the conductive contact; introducing an anti-sticking material through the first via and the micro channel to form an anti-sticking layer on the inner surface of the first chamber; and filling a conductive material to the first via and the second via to seal the first via and electrically connect the second substrate and the conductive contact.

The pressure sensor according to another embodiment of the present invention comprises a first substrate, a second substrate and an anti-sticking layer. The first substrate comprises a metal layer, wherein the metal layer is partially exposed on a surface of the first substrate to form a first circuit, a second circuit and a conductive contact. The second substrate comprises a first surface, a second surface and at least one contact via, the contact via penetrates the first surface and the second surface of the second substrate and is sealed by filler, wherein the second substrate faces the surface of the first substrate with the first surface and is electrically connected to the conductive contact. The second substrate comprises a MEMS element and a reference element. The MEMS element corresponds to the first circuit and defining an airtight chamber with the first substrate and the second substrate, wherein the chamber comprises at least one micro channel extending to the contact via. The reference element corresponds to the second circuit and retaining a fixed distance with the second circuit. The anti-sticking layer is configured on the inner surface of the chamber.

Other advantages of the present invention will become apparent from the following descriptions taken in conjunction with the accompanying drawings wherein certain embodiments of the present invention are set forth by way of illustration and examples.

BRIEF DESCRIPTION OF THE DRAWINGS

The foregoing aspects and many of the accompanying advantages of this invention will become more readily appreciated as the same becomes better understood by reference to the following detailed descriptions, when taken in conjunction with the accompanying drawings, wherein.

DESCRIPTION OF THE PREFERRED EMBODIMENT

Figure 1:
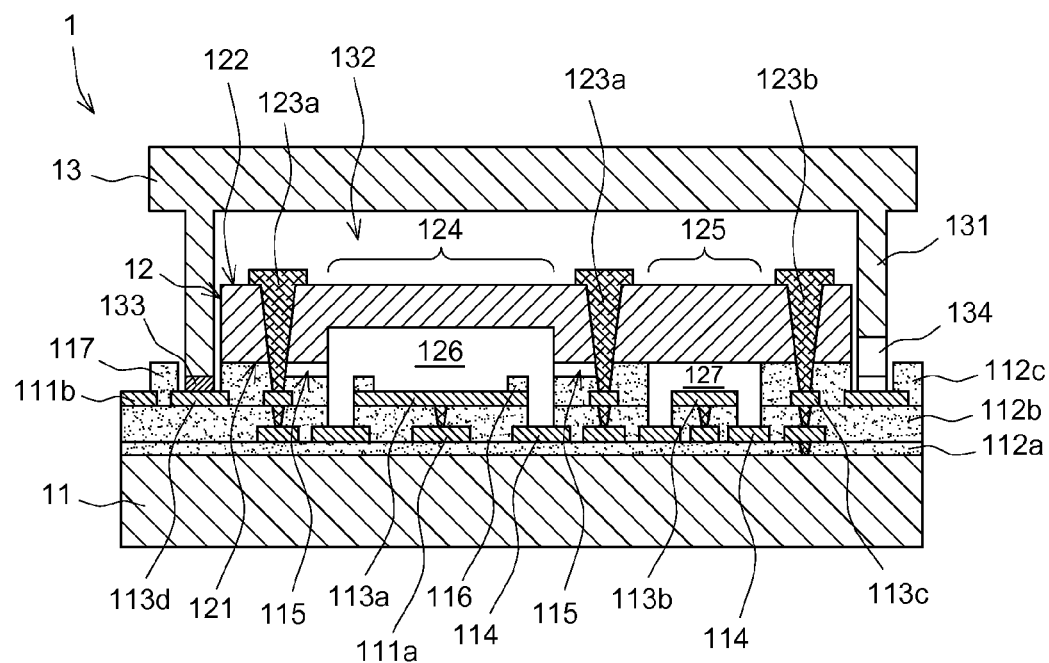
FIG. 1 is a cross-sectional diagram showing a pressure sensor of a preferred embodiment of the present invention.
Figure 2:
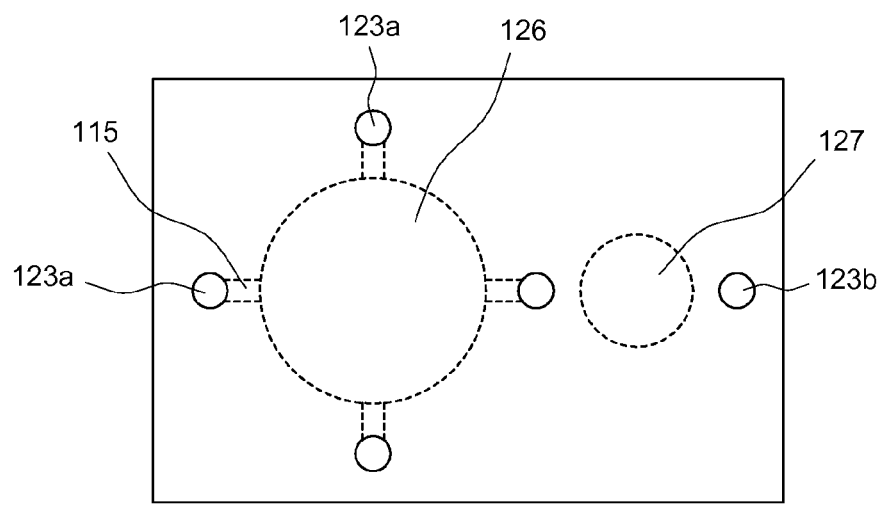
FIG. 2 is a schematic diagram showing the layout of the chamber, the micro channel and the contact via of the pressure sensor of a preferred embodiment of the present invention.

The pressure sensor of the present invention is accomplished with the MEMS device. Referring to FIG. 1 and FIG. 2, the pressure sensor 1 of one preferred embodiment of the present invention comprises a first substrate 11, a second substrate 12 and an anti-sticking layer (not shown). The first substrate 11 comprises at least one metal layer. In the embodiment shown in FIG. 1, the first substrate 11 comprises the metal layer 111a and 111b, and the metal layer 111b on the upper layer is partially exposed on the surface of the first substrate 11. The exposed metal layer 111b is capable of being a first circuit 113a, a second circuit 113b and a conductive contact 113c. In one preferred embodiment, the first substrate 11 is a complementary metal oxide semiconductor substrate.

The second substrate 12 comprises a first surface 121 and a second surface 122, and the second substrate 12 faces the surface of the first substrate 11 with the first surface 121 and is electrically connected to the conductive contact 113c of the first substrate 11. For example, the second substrate 12 comprises at least one conductive via 123b penetrating the first surface 121 and the second surface 122 of the second substrate 12. The conductive via 123b is electrically connected to the conductive contact 113c and the second substrate 12 through an ohmic contact, wherein the ohmic contact id formed by the conductive via 123b and the second surface 122 of the second substrate 12 or the side wall of the conductive via 123b. In one preferred embodiment, the ohmic contact region is made of at least one of silicon, aluminum-copper alloy, titanium nitride and tungsten. The second substrate 12 further comprises a contact via 123a, and the contact via 123 also penetrates the first surface 121 and the second surface 122 of the second substrate 12 and is sealed by filler. In one preferred embodiment, the filler in the contact via 123a may be the same or different material with the conductive material (such as tungsten) in the conductive via 123b. Here, it should be noted that the conductive via 123b and the contact via 123a may be integrated together. For example, the filler in the contact via 123a is a conductive material, and the metal layer 111b connecting the contact via 123a is a well-designed conductive contact as well, so that the contact via 123a may be used as a conductive via and provide an alternative conductive path of the electrical connection between the first substrate 11 and the second substrate 12. Besides, the conductive via 123b may be omitted as well.

Further, the second substrate 12 comprises a MEMS element 124 and a reference element 125. The MEMS element 124 corresponds to the first circuit 113a of the first substrate 11 and defines an airtight chamber 126 with the first substrate 11 and the second substrate 12. The pressure difference between the inside and the outside of the chamber 126 may create a deformation of the MEMS element 124 forward or backward the first substrate 11. The MEMS element 124 is electrically coupled to the first circuit 113a to measure the deformation quantity of the MEMS element 124. The reference element 125 corresponds to the second circuit 113b and retains a fixed distance with the second circuit 113b. Simply speaking, the reference element does not deform with the pressure difference, so that the reference element 125 is electrically coupled to the second circuit 113b to provide a stable reference signal. In One preferred embodiment, the thickness of the reference element 125 may be increased to avoid the reference element 125 deforming with the outside pressure difference.

Referring to FIG. 1, the first substrate 11 and the second substrate further define a micro channel 115 extending from the chamber 126 to the contact via 123a. In other words, the micro channel 115 connects the chamber 126 and the contact via 123a. Therefore, in the manufacture process, the anti-sticking material may be introduced to the chamber 126 via the contact via 123a and the micro channel 115, and form the anti-sticking layer on the inner surface of the chamber 126. In one preferred embodiment, the anti-sticking material may be the self-assembled monolayer (SAM) material, such as dichlordimethylsilane (DDMS), octadecyltrichlorsilane (OTS), perfluoroctyltrichlorsilane (PFOTCS), perfluorodecyl-trichlorosilane (FDTS), or fluoroalkylsilane (FOTS). The anti-sticking layer on the inner surface of the chamber 126 is capable of avoiding the sticking of MEMS element 124 to the first substrate 11. Furthermore, an anti-moving bump 116 may be configured on the surface of the first substrate 11 corresponding to the MEMS element 124 to reduce the contacting area of the MEMS element 124 and the first substrate 11 and prevent sticking and failing of the MEMS element 124 and the first substrate 11.

The third substrate 13 comprises a plurality of bracket structure 131 surrounding a notch region 132. The third substrate 13 is configured above the second substrate 12 and is connected to the first substrate 11 through the bracket structure 131 to place the second substrate 12 in the notch region 132 of the third substrate 13. In one preferred embodiment, the third substrate 13 is conductive and the contact pad 133 is provided at the terminal of the bracket structure 131. The third substrate 13 is eutectically bonded with the first substrate 11 so that the contact region 113d of the contact pad 133 and the first substrate 11 form a low resistance conductive contact. For example, the third substrate 13 may be made of at least one of silicon-doped ceramics having conductive plating, glass having Indium Tin Oxide (ITO) coating, and Tantalum oxide. The third substrate 13 is also provided with a channel 134 connecting the notch region 132 and the outside to make the pressure of the notch region 132 and the outside equal. In one preferred embodiment, the channel 134 is configured on the terminal of the bracket structure 131.

Figure 3:
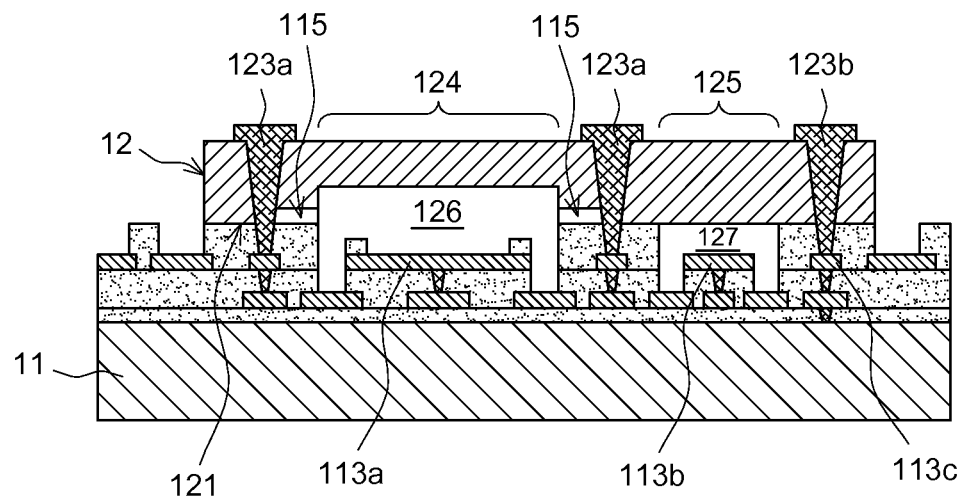
FIG. 3 is a cross-sectional diagram showing a pressure sensor of another preferred embodiment of the present invention.

In the embodiment shown in FIG. 1, the micro channel 115 is configured on side of the first substrate 11, which forms a trench on the surface of the first substrate 11 and then connects the first substrate 11 and the second substrate 12 to form the micro channel 115. In one preferred embodiment, referring to FIG. 3, the micro channel 115 may be also configured on one side of the second substrate 12, which forms a trench on the first surface 121 of the second substrate 12 and then connects the first substrate 11 and the second substrate 12 to form the micro channel 115.

Figure 4:
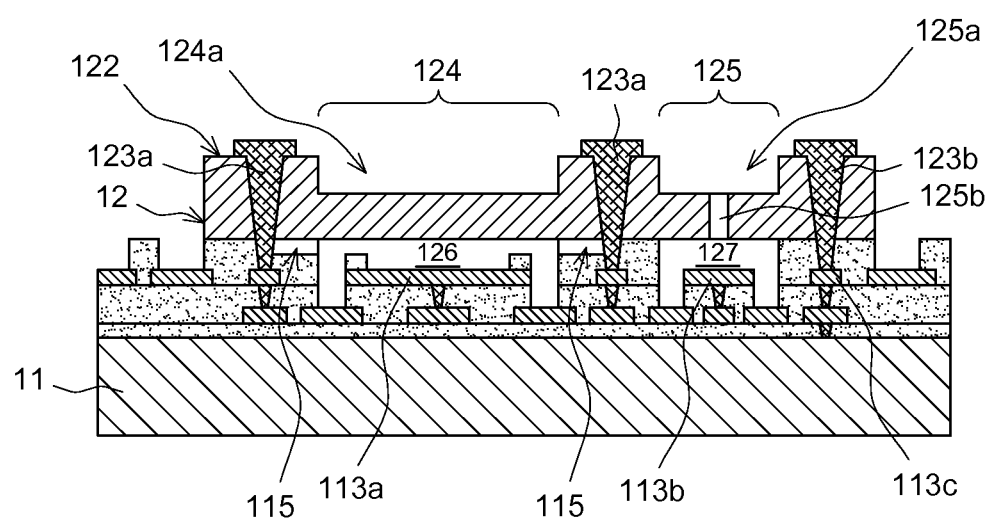
FIG. 4 is a cross-sectional diagram showing a pressure sensor of further preferred embodiment of the present invention.

In the embodiment shown in FIG. 1, a notch is formed on side of the first surface 121 of the second substrate 12 for thinning the MEMS element 124. The notch 124a may be also formed on one side of the second surface 122 of the second substrate 12 for thinning the MEMS element 124, as shown in FIG. 4. In one preferred embodiment, a notch 125a may be also formed on side of the second surface 122 of the second substrate 12 for thinning the reference element 125. In order to avoid the deformation between the thinned reference element 125 and the outside pressure difference, a channel 125b may be configured to connect the chamber 127 which is defined by the reference element 125 and then there is no pressure difference between the chamber 127 and the outside environment. Hence, the reference element 125 will not have the deformation caused by the outside pressure difference.

Figure 5:
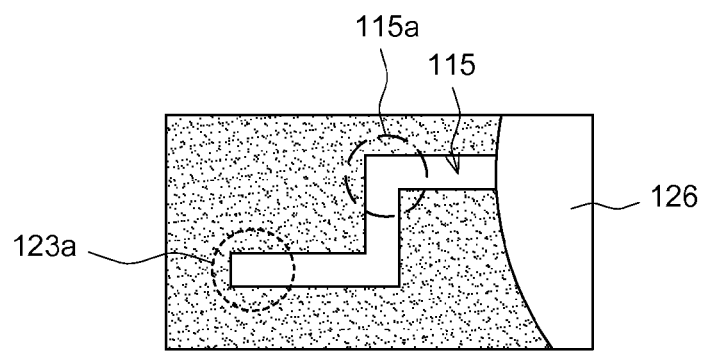
FIG. 5 is a partial schematic diagram showing the structure of the micro channel of the pressure sensor of a preferred embodiment of the present invention.

Referring FIG. 5 which is a partial schematic diagram showing the structure of the micro channel of the unconnected second substrate 12. In the embodiment shown in FIG. 5, the micro channel 115 comprises a bent portion 115a bending to horizontal direction (along the border surface of the first substrate and the second substrate). Therefore, when the filler is filled in the contact via 123a, the filler will be deposited in the bent portion 115a without contaminating the chamber 126. It may be understood that the same function may be also performed by the micro channel 115 having a bent portion bending to vertical direction (vertical to the first surface of the second substrate).

Figure 6:
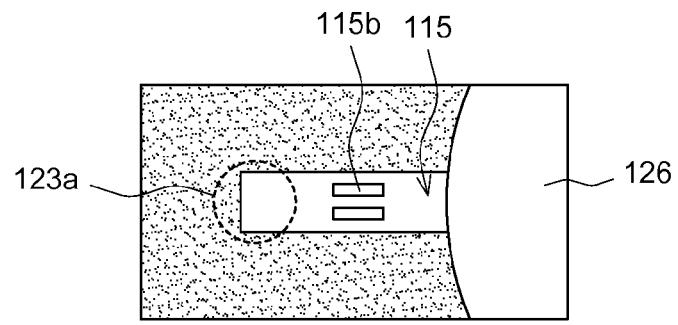
FIG. 6 is a partial schematic diagram showing the structure of the micro channel of the pressure sensor of a preferred embodiment of the present invention.
Figure 7:
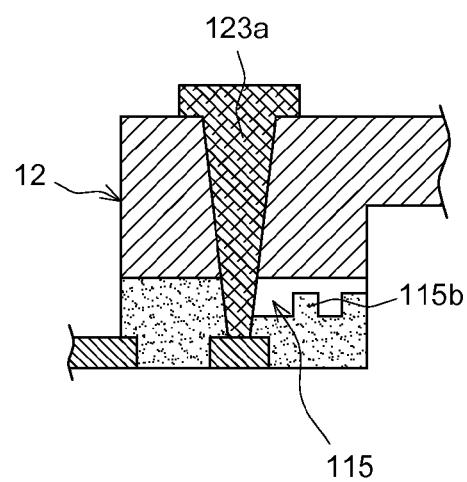
FIG. 7 is a partial cross-sectional diagram showing the structure of the micro channel of the pressure sensor of a preferred embodiment of the present invention.

Referring to FIG. 6, in one preferred embodiment, at least one dam 115b may be configured in the micro channel 115. The dam 115b may reduce the inner diameter of the micro channel 115, and then the anti-sticking material may pass through and the filler will tend to be deposited in the dam 115b without contaminating the chamber 126. In another preferred embodiment, referring to FIG. 7, the dam 115b may also reduce the inner diameter of the micro channel 115 on vertical direction and only the above portion of the micro channel 115 cab be passed through, so that the filler may be blocked by the dam 115b before or between the dam 115b.

Please refer to FIGS. 8a to 8h which are cross-sectional diagrams showing the manufacture steps of the pressure sensor of a preferred embodiment of the present invention. First, a first substrate 11 comprising a driving circuit and/or a detecting circuit is provided. The analog and/or digital circuits may be used in the first substrate 11, and are generally implemented by using application-specific integrated circuit (ASIC) designed devices. The first substrate 11 may be also named the electrode substrate. In one preferred embodiment of the present invention, the first substrate 11 may be any substrate with suitable mechanic stiffness, such as complementary metal oxide semiconductor (CMOS) substrate or glass substrate. Only one chip is shown in the cross-sectional figures, however, it is understood, a plurality of chips may be formed on one substrate. It is only used for explaining the present invention with single device, not for limiting the manufacture method. In the following specification, a complete explanation of the wafer level process applied to a substrate to manufacture a plurality of chips or devices will be described. After manufacturing the devices, the dicing and singulation technologies will be applied to produce the single-device package to fit all applications.

Figure 8A:
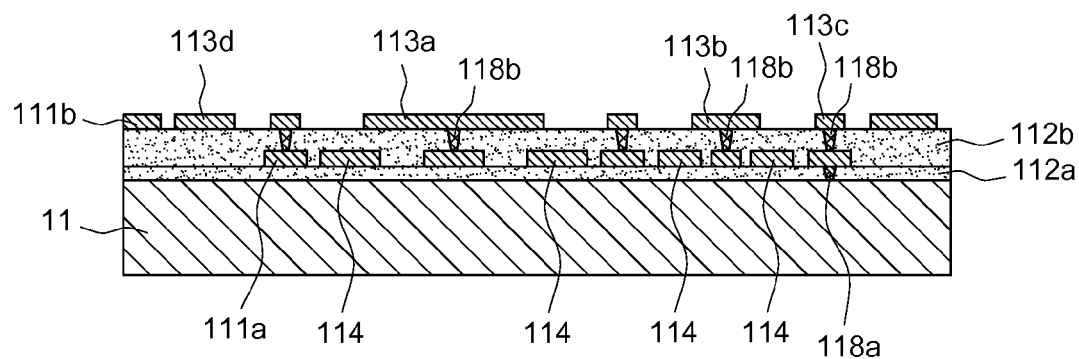
FIGS. 8a to 8h are cross-sectional diagrams showing the manufacture steps of the pressure sensor of a preferred embodiment of the present invention.

Referring to FIG. 8a, a first dielectric layer 112a with a predetermined thickness is configured on the first substrate 11. In one preferred embodiment, the first dielectric layer 112a may be a $SiO_2$ layer; however, other suitable materials may be used in the present invention as well and are also in the scope of the present invention. For example, in another embodiment, $Si_3N_4$ or Silicon oxynitride (SiON) may be deposited to form the first dielectric layer 112a. In a further embodiment, a polysilicon material, including the amorphous polysilicon, may be deposited to form the first dielectric layer 112a. Any material with appropriate characteristic, including having mighty connection to the substrate, having great attachment to the first substrate 11, and having suitable mechanic stiffness, may be used to replace the $Si_xO_y$ material. In some specific applications, a buffer layer may be used in the deposition process of the first dielectric layer 112a.

In some embodiments, the first dielectric layer 112a is formed by multiple deposition and polishing processes. For example, the first portion of the first dielectric layer 112a may be formed by using the high-density plasma (HDP) deposition process, and then using the chemical mechanical planarization (CMP) process to polish. The density of the device feature is variable resulted in a relative horizontal position difference, in other words, the deposition layer probably has an uneven upper surface. Hence, the multiple deposition and polishing processes may form an even and flat surface. The example of the deposition technology includes Tetraethyl Orthosilicate (TEOS), High-Density Plasma (HDP), Chemical Vapor Deposition (CVD), Low Pressure Chemical Vapor Deposition (LPCVD) and Thermal Oxidation. Besides, other materials may be also applied when a final layer (such as oxide) is covered.

In some embodiments, the deposition of the first dielectric layer 112a is processed based on the structure of the substrate. For example, when the first substrate 11 is a complementary metal oxide semiconductor (CMOS) substrate, the higher temperature deposition process may damage the metal layer or cause the diffusion effect on the contacting surface of the circuits, and some circuits on the substrate may be affected. Therefore, in one specific embodiment of the present invention, the lower temperature deposition, patterning and etching processes, such as processes in temperature lower than 500° C., are used to form the layers shown in FIGS. 8a to 8h. In another specific embodiment of the present invention, the deposition, patterning and etching processes are performed in the temperature lower than 450° C. to form the layers shown in figures. After the first dielectric layer 112a is formed, it may be further patterned and etched to form multiple first interconnect via 118a. The first interconnect via 118a provides the electrical connection between the first substrate 11 and the first metal layer 111a later formed on the first dielectric layer 112a, and this process will be further explained later.

Then, a first metal layer 111a is formed above the first dielectric layer 112a. The first metal layer fills in the first interconnect via 118a. In some embodiments, the first interconnect via 118a may be filled by a conductive material (such as tungsten). In one preferred embodiment, the first metal layer 111a is deposited by using plating, Physical Vapor Deposition (PVD) or Chemical Vapor Deposition (CVD) processes. FIG. 8a shows the first substrate 11 and the patterned first metal layer 111a after the etching process. For thoroughly explaining the present invention, a lithography process is not shown in the manufacture process, wherein a photoresist layer is deposited on the first metal layer 111a and then is patterned to form an etching mask. In the lithography process, the size of the etching mask may be strictly controlled, and may be performed by using any suitable material resisting the etching process while etching the metal layer. In one specific embodiment, the $Si_3N_4$ is used as the etching mask. Although a one-dimensional cross-sectional diagram is shown in FIG. 8a, it should be understood that a predetermined two-dimensional pattern is formed on the metal layer, however, In one embodiment, the first metal layer 111a is made of aluminum, copper, aluminum-copper-silicon alloy, tungsten and titanium nitride.

Then, a second dielectric layer 112b is formed above the first dielectric layer 112a. In some preferred embodiments, the process and material to form the second dielectric layer 112b is similar to the process of forming the first dielectric layer 112a. In other embodiments, the process and material to form the second dielectric layer 112b is different to the process of forming the first dielectric layer 112a. In other embodiments, the process and material to form the second dielectric layer 112b is partially similar to and partially different from the process of forming the first dielectric layer 112a. After the second dielectric layer 112b is formed, it will then be patterned and etched to form multiple second interconnect via 118b. The second interconnect via 118b provides the electrical connection between the first metal layer 111a and the second metal layer 111b later formed on the second dielectric layer 112b, and this process will be explained more later.

Then, a second metal layer 111b is formed above the second dielectric layer 112b. The second metal layer 111b fills in the second interconnect via 118b. In some embodiments, the second interconnect via 118b may be filled by a conductive material (such as tungsten). The patterned second metal layer 111b may be used as the electrode of the MEMS device, such as the first circuit 113a and the second circuit 113b used as detecting and/or driving circuits, the conductive contact 113c electrically connected to the second substrate 12, or the contact region 113d connecting to the third substrate 13. The contact region 113d comprises a conductive material having sufficient mechanic stiffness to support the connection interface. In one specific embodiment, the contact region 113d and the first substrate 11 form a low resistance ohmic contact. In some embodiments, the contact region 113d is made of germanium, aluminum or copper. In other embodiments, the contact region 113d may be also made of other materials, such as gold, indium, or other solder capable of bottom-mounting and moistly improving metal stack.

Figure 8B:
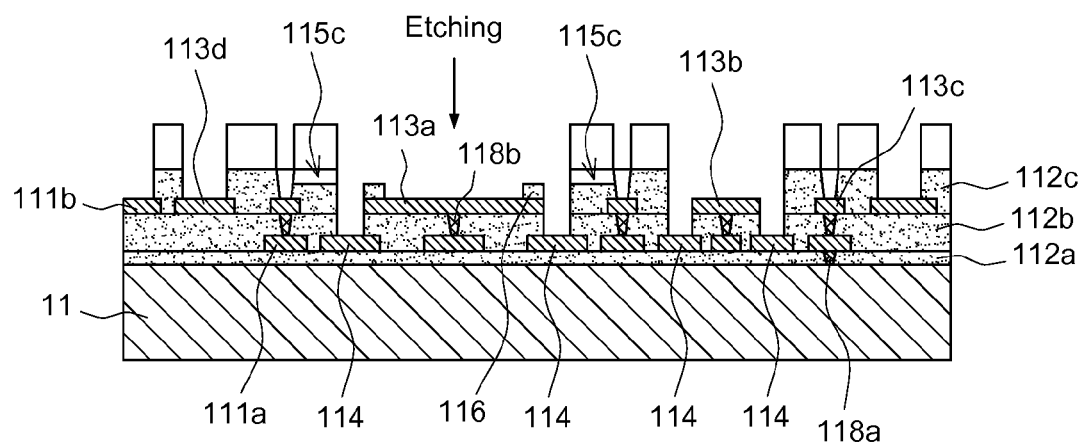

Referring to FIG. 8b, a third dielectric layer 112c is formed above the second dielectric layer 112b. The process and material to form the third dielectric layer 112c is similar to the process of forming the second dielectric layer 112b shown in FIG. 8a. Then, the third dielectric layer 112c is patterned to form at least one trench 115c. After connecting the second substrate 12 and the first substrate 11, the trench 115c may form the micro channel 115. The etching process comprise one or more than one etching steps, such as anisotropic etching, oxide etching, wet etching or dry etching, for example Reactive Ion Etching (RIE). In one preferred embodiment, the etching process may define one or multiple mechanic anti-moving structures of the MEMS elements, which are anti-moving bumps 116. In one preferred embodiment, one or multiple buffer layers may be used as etching stop layer. For example, the metal layer 114 of the first metal layer 111a may prevent the exposure of the first dielectric layer 112a. The person skilled in the art should understand the change, modify or replace of the embodiments is still in the scope of the present invention. In one preferred embodiment, the etching process may also define multiple fences 117. The fences 117 are configured for surrounding the contact region 113d of the third substrate 13 to prevent migrating of metal in the connection process and failing of the device.

Figure 8C:
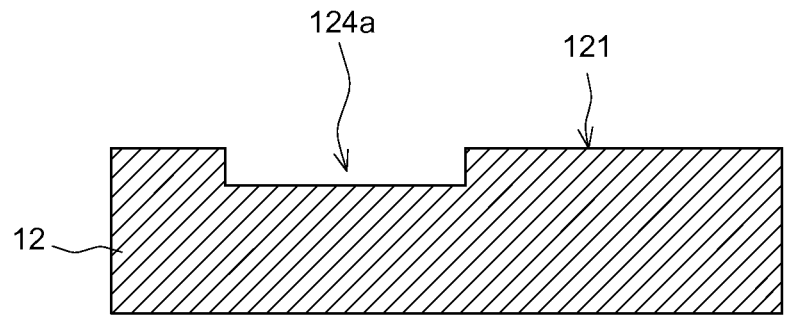

Referring to FIG. 8c, a second substrate 12 is provided and a notch 124a is formed on the first surface 121 of the second substrate 12. When the second substrate 12 and the first substrate 11 are connected, the notch 124a may help to reduce the interference from the first substrate 11. It is understood that the notch may be also formed on the position corresponding to the reference element 125, and the final thickness of the reference element 125 has to thicker than that of the MEMS element 124, or a suitable channel has to be formed to avoid the deformation of the reference element 125. It has to be noted that this step may be also omitted when manufacturing the embodiment shown in FIG. 4, and the notch 124a will be formed on the second surface 122 of the second substrate 12 in the later steps. Further, for manufacturing the embodiment shown in FIG. 3, the trench corresponding to the micro channel 115 has to be formed on the first surface 121 of the second substrate 12 in this step.

Figure 8D:
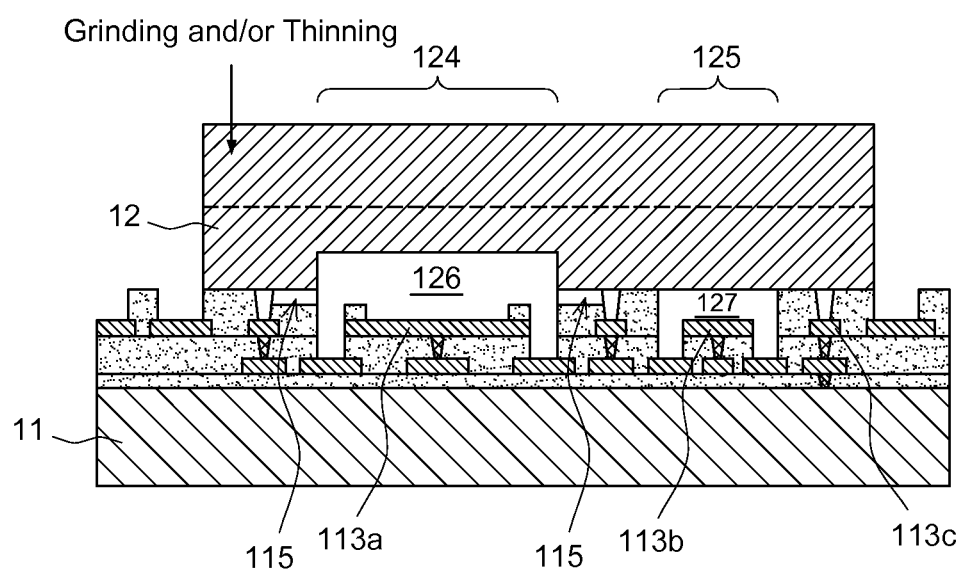

Referring to FIG. 8d, the first surface 121 of the second substrate 12 is faced to the first substrate 11 and is mounted to the first substrate 11. The mounting of the second substrate 12 and the first substrate 11 may be achieved by using one of the methods of fusion bond, eutectic bonding, conductive eutectic bonding, soldering and bonding. In some embodiments, the Anisotropic Conductive Film (ACF) may be used to bond the second substrate 12 to the first substrate 11. After the second substrate 12 and the first substrate 11 are connected, a first chamber 126, a second chamber 127 and at least one micro channel 115 are defined, wherein the first circuit 113a is configured in the first chamber 126, the second circuit 113b is configured in the second chamber 127, and the micro channel 115 extends outward from the first chamber 126 along the border surface of the first substrate 11 and the second substrate 12.

Figure 8E:
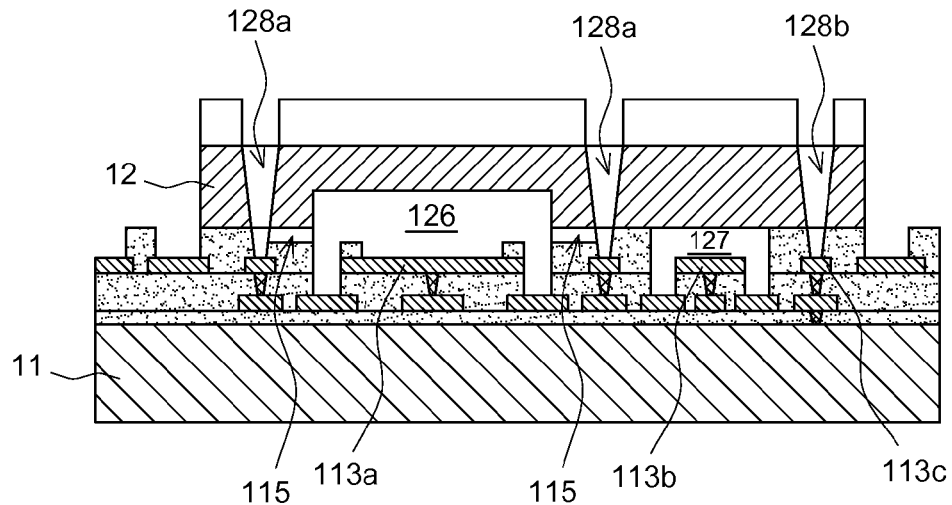

Then, a grinding and/or other thinning procedures are performed to the second substrate 12 to thin the second substrate 12 to a predefined thickness. As shown in FIG. 8e, in some embodiments, the remained thickness of the thinned region corresponding to the MEMS element 124 is about 10 µm to 100 µm, and the MEMS element 124 may be deformed with the pressure difference. The predefined thickness may be achieved by using the traditional thinning technology, such as chemical mechanical planarization (CMP), wet etching and/or dry etching, for example Reactive Ion Etching (RIE) technologies. There is no stopping layer to end the thinning process in the embodiment shown in FIG. 8d, and the thinning process adopts an exact control. Without the exact control of the thinning process, the thickness of the second substrate 12 may be thinner or thicker than the predefined thickness, and the function of the manufactured MEMS device will be affected. In other embodiments, an etching stopping layer is integrated into the second substrate 12 for the exact control of the thinning process. The person skilled in the art should understand the change, modify or replace of the embodiments is still in the scope of the present invention.

Referring to FIG. 8e, the second substrate 12 is patterned and etched to form a first via 128a and a second via 128b. The first via 128a and the second via 128b penetrate the first surface 121 and the second surface 122 of the second substrate 12. The first via 128a is connected to the micro channel 115, and the first chamber 126 may be connected to the outside through the first via 128a and the micro channel 115. The second via 128b corresponds to the conductive contact 113c to expose the conductive contact 113c.

Figure 8F:
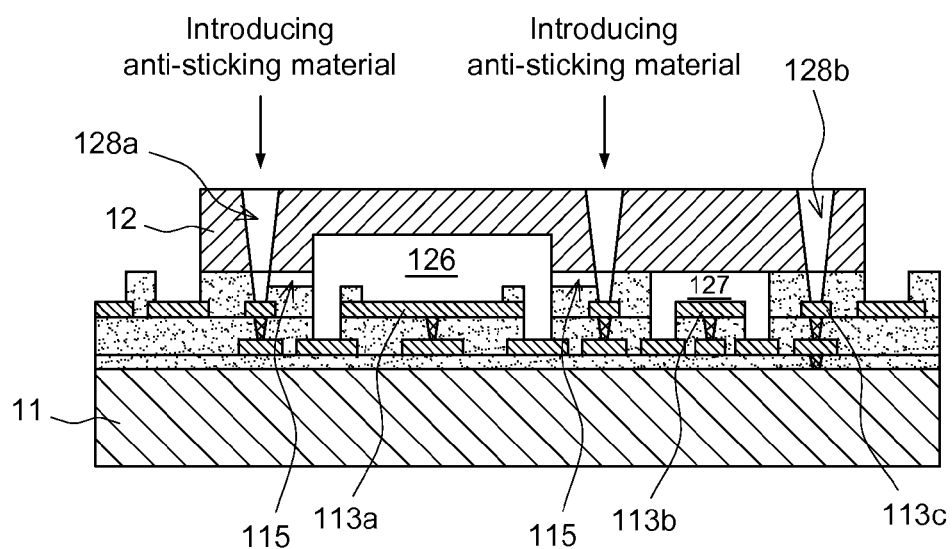

Referring to FIG. 8f, since the first chamber 126 may be connected to the outside through the first via 128a and the micro channel 115, the anti-sticking material may be introduced into the chamber 126 through the first via 128a and the micro channel 115 to form an anti-sticking layer (not shown) on the inner surface of the first chamber 126. The anti-sticking material has been described above and will not be repeated again here.

Figure 8G:
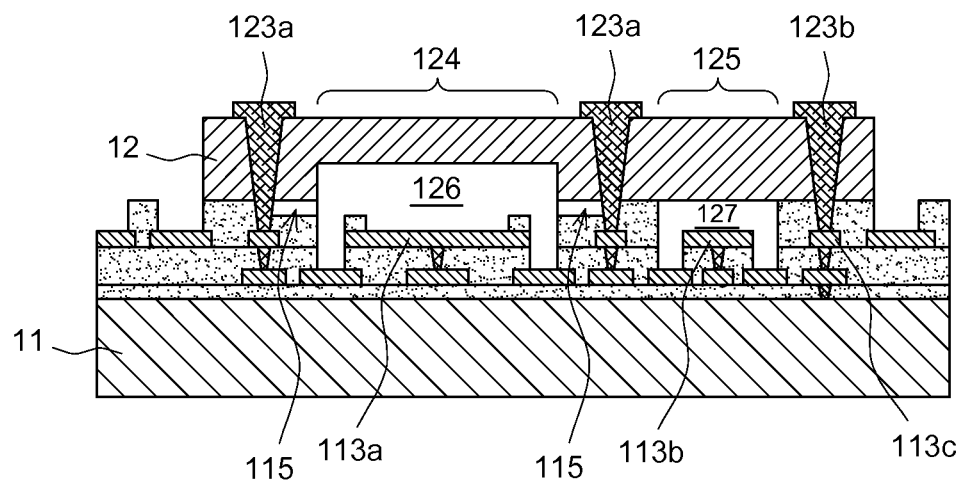

Referring to FIG. 8g, then, a filler is filled into the first via 128a to seal the first via 128a. A conductive material (such as tungsten) is introduced to the second via 128b to make the second via 128b be a conductive via 123b and electrically connect the second substrate 12 and the conductive contact 113c of the first substrate 11. In one preferred embodiment, the filler in the first via 128a may be the same as that in the second via 128b. As described above, the forming and filling the first via 128a and the second via 128b may be finished together in the same process. Therefore, there is no extra processing step needed to open and close the micro channel 115, and the process is essentially simplified.

Figure 8H:
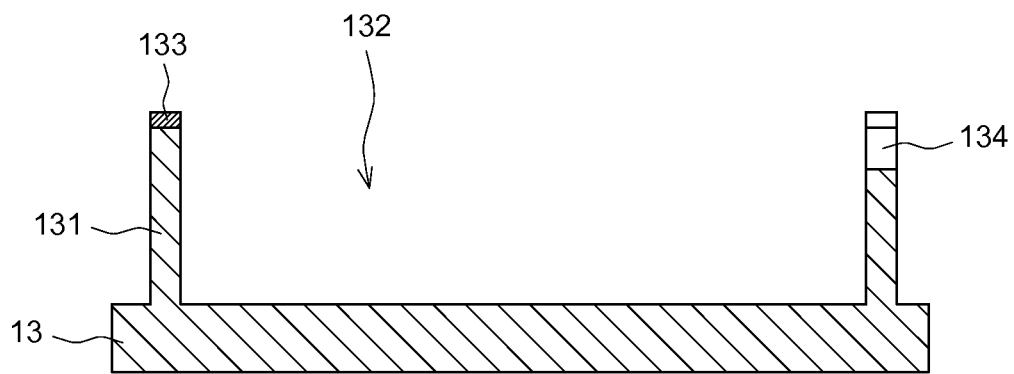

Referring to FIG. 8h, a third substrate 13 is provided. In some embodiments, the third substrate 13 is made of doped silicon, ceramic with a conductive coating, glass covered by a conductive coating (such as ITO), or metal layer like Tantalum oxide. A sticking layer is placed on the surface of the third substrate 13. The sticking layer may assist the mounting between the third substrate 13 and the first substrate 11. In some embodiments, the sticking layer is formed by depositing a seed layer, such as titanium/gold, and then depositing a conductive layer (such as plating gold). Then, the third substrate 12 is patterned and etched to form a plurality of bracket structure 131. The third substrate 13 is etched to form the bracket structure 131, and a notch region 132 is formed on the third substrate 13. The partial sticking layer is remained on the bracket structure 131 to form the contact pad 133. The notch region 132 may be configured surrounding the second substrate 12. The horizontal size of the notch region 132 is selected according to the geometric structure of the second substrate 112 covered by the third substrate 13. In one embodiment, in the process of forming the bracket structure 131, one or multiple trenches may be formed at the terminal of the bracket structure 131. When the third substrate 13 is connected to the first substrate 11 through the bracket structure 131, the trenches may be used as the channel 134 connecting the notch region 132 and the outside, as shown in FIG. 1. The connection step of the third substrate 13 and the first substrate 11 may be achieved by using one of the methods of fusion bond, glass frit bonding, eutectic bonding, conductive eutectic bonding, soldering and bonding. In some embodiments, the temperature while connecting the third substrate 13 and the first substrate 11 is lower than the temperature while connecting the second substrate 12 and the first substrate 11 to protect the MEMS element 124. The third substrate 13 is conductive and may shield the electromagnetic disturbance (EMI) of the second substrate 12. It is noted that the third substrate 13 is an optional device, and that is under the condition without the third substrate 13, the pressure sensor of the present invention may be also functioned.

To sum up the foregoing descriptions, the pressure sensor using the MEMS device and the manufacture method thereof require no extra semiconductor process to achieve the present invention that open the micro channel, coat the anti-sticking layer on the inner surface of the chamber, and then seal the micro channel to keep the chamber airtight. Therefore, the pressure sensor using the MEMS device according to the present invention and the manufacture method thereof may essentially simplify the manufacture process to coat the anti-sticking layer on the inner surface of the airtight chamber to prevent the failure of the MEMS device caused by sticking of the movable MEMS element.

While the invention can be subject to various modifications and alternative forms, a specific example thereof has been shown in the drawings and is herein described in detail. It should be understood, however, that the invention is not to be limited to the particular form disclosed, but on the contrary, the invention is to cover all modifications, equivalents, and alternatives falling within the spirit and scope of the appended claims.

What is claimed is:

1. A manufacture method of a pressure sensor, comprising:
    providing a first substrate comprising a metal layer, wherein the metal layer is partially exposed on a surface of the first substrate to form a first circuit, a second circuit and a conductive contact;
    providing a second substrate having a first surface and a second surface;
    mounting the second substrate to the surface of the first substrate in which the first surface of the second substrate faces to the first substrate to define a first chamber, a second chamber and at least one micro channel, wherein the first circuit is configured in the first chamber, the second circuit is configured in the second chamber, and the micro channel extends outward from the first chamber along the border surface of the first substrate and the second substrate;
    forming a MEMS element and a reference element on the second substrate, wherein the MEMS element corresponds to the first circuit, and the reference element corresponds to the second circuit;
    forming at least a first via and a second via, wherein the first via and the second via penetrate the first surface and the second surface of the second substrate, the first via is connected to the micro channel, and the second via corresponds to the conductive contact;
    introducing an anti-sticking material through the first via and the micro channel to form an anti-sticking layer on the inner surface of the first chamber; and
    filling a conductive material to the first via and the second via to seal the first via and electrically connect the second substrate and the conductive contact.

2. The manufacture method of the pressure sensor according to claim 1, further comprising:
    forming at least one trench on the surface of the first substrate or the first surface of the second substrate to define the micro channel.

3. The manufacture method of the pressure sensor according to claim 1, wherein the micro channel comprises a bent portion bending to horizontal or vertical direction.

4. The manufacture method of the pressure sensor according to claim 1, wherein the micro channel comprises a dam for reducing the inner diameter of the micro channel.

5. The manufacture method of the pressure sensor according to claim 1, further comprising:
    forming a notch on a side of the first surface or a side of the second surface of the second substrate for thinning the MEMS element.

6. The manufacture method of the pressure sensor according to claim 1, further comprising:
    forming an anti-moving bump on the surface of the first substrate corresponding to the MEMS element.

7. The manufacture method of the pressure sensor according to claim 1, wherein the second via is further connected to the micro channel.

8. The manufacture method of the pressure sensor according to claim 1, wherein the conductive material in the second via and the second substrate form an ohmic contact, wherein the ohmic contact region comprises at least one of silicon, aluminum-copper alloy, titanium nitride and tungsten.

9. The manufacture method of the pressure sensor according to claim 1, wherein the first substrate comprises a complementary metal oxide semiconductor substrate.

10. The manufacture method of the pressure sensor according to claim 1, further comprising:
    providing a third substrate, having a notch region and a plurality of bracket structure; and
    connecting the third substrate to the surface of the first substrate through the bracket structure to place the second substrate in the notch region.

11. The manufacture method of the pressure sensor according to claim 10, wherein the third substrate comprises a channel configured on the terminal of the bracket structure.

12. A pressure sensor, comprising:
    a first substrate, comprising a metal layer, wherein the metal layer is partially exposed on a surface of the first substrate to form a first circuit, a second circuit and a conductive contact;
    a second substrate, comprising a first surface, a second surface and at least one contact via, the contact via penetrates the first surface and the second surface of the second substrate and is sealed by a filler, wherein the second substrate faces the surface of the first substrate with the first surface and is electrically connected to the conductive contact, wherein the second substrate comprising:
        a MEMS element, corresponding to the first circuit and defining an airtight chamber with the first substrate and the second substrate, wherein the chamber comprises at least one micro channel extending to the contact via; and
        a reference element, corresponding to the second circuit and retaining a fixed distance with the second circuit; and
    an anti-sticking layer, locating on the inner surface of the chamber.

13. The pressure sensor according to claim 12, wherein the micro channel comprises a bent portion bending to horizontal or vertical direction.

14. The pressure sensor according to claim 12, wherein the micro channel comprises a dam for reducing the inner diameter of the micro channel.

15. The pressure sensor according to claim 12, wherein the micro channel is configured on the first substrate.

16. The pressure sensor according to claim 12, wherein the micro channel is configured on the second substrate.

17. The pressure sensor according to claim 12, wherein the MEMS element comprises a notch configured on side of the first surface or side of the second surface.

18. The pressure sensor according to claim 12, wherein an anti-moving bump is configured on the surface of the first substrate corresponding to the MEMS element.

19. The pressure sensor according to claim 12, wherein the second substrate comprises a conductive via penetrating the first surface and the second surface of the second substrate, wherein the conductive via is electrically connected to the conductive contact and the second substrate through an ohmic contact, and the ohmic contact region comprises at least one of silicon, aluminum-copper alloy, titanium nitride and tungsten.

20. The pressure sensor according to claim 19, wherein the conductive via is integrated to the contact via.

21. The pressure sensor according to claim 12, wherein the first substrate comprises a complementary metal oxide semiconductor substrate.

22. The pressure sensor according to claim 12, further comprising:
a third substrate having a notch region and a plurality of bracket structure, wherein the third substrate is configured above the second substrate and is connected to the first substrate through the bracket structure so that the second substrate is accommodated in the notch region.

23. The pressure sensor according to claim 22, wherein the third substrate comprises a channel configured on the terminal of the bracket structure.

* * * * *